(12) United States Patent
Carlson et al.

(10) Patent No.: US 10,621,483 B2
(45) Date of Patent: Apr. 14, 2020

(54) POWER ACTIVATION VIA CONDUCTIVE CONTACT LABEL

(71) Applicant: Intel Corporation, Santa Clara, CA (US)

(72) Inventors: Christopher R. Carlson, Beaverton, OR (US); Edward O. Clapper, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/235,108

(22) Filed: Dec. 28, 2018

(65) Prior Publication Data

US 2019/0138869 A1    May 9, 2019

(51) Int. Cl.
| | |
|---|---|
| G06K 19/00 | (2006.01) |
| G06K 19/07 | (2006.01) |
| G06K 19/073 | (2006.01) |
| H01L 23/498 | (2006.01) |

(52) U.S. Cl.
CPC ..... *G06K 19/0702* (2013.01); *G06K 19/0709* (2013.01); *G06K 19/07309* (2013.01); *H01L 23/49855* (2013.01)

(58) Field of Classification Search
USPC ........................................................ 235/492
See application file for complete search history.

(56) References Cited

U.S. PATENT DOCUMENTS

| | | | |
|---|---|---|---|
| 2005/0236479 A1* | 10/2005 | Schmidtberg | G01D 9/005 235/384 |
| 2011/0006119 A1* | 1/2011 | Honda | G06K 19/07749 235/492 |
| 2015/0324745 A1* | 11/2015 | Goodall | G06Q 10/08355 705/337 |
| 2017/0053290 A1* | 2/2017 | Atkinson | G06Q 10/0832 |
| 2018/0365548 A1* | 12/2018 | Karani | G06K 19/07762 |

* cited by examiner

*Primary Examiner* — Daniel A Hess
(74) *Attorney, Agent, or Firm* — Schwegman Lundberg & Woessner, P.A.

(57) ABSTRACT

Various mechanisms for implementing power activation of electronic tags via conductive contact labels are provided herein. An electronic shipping tag includes a housing to enclose: a printed circuit board having: a battery; load circuitry; and a plurality of pins that project from the housing, such that when contacted with a conductive substrate, cause activation of the load circuitry.

12 Claims, 5 Drawing Sheets

POWER ACTIVATION VIA CONDUCTIVE CONTACT LABEL

TECHNICAL FIELD

Embodiments described herein generally relate to electronic tags, and in particular, to power activation of electronic tags via conductive contact labels.

BACKGROUND

Sensor motes and similar tagging and tracking devices are often designed for one-time usage, such as tagging a shipped cargo item from its source to its destination. The tagging devices are used to track cargo as it proceeds through various shipping channels.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

Figure 1A:
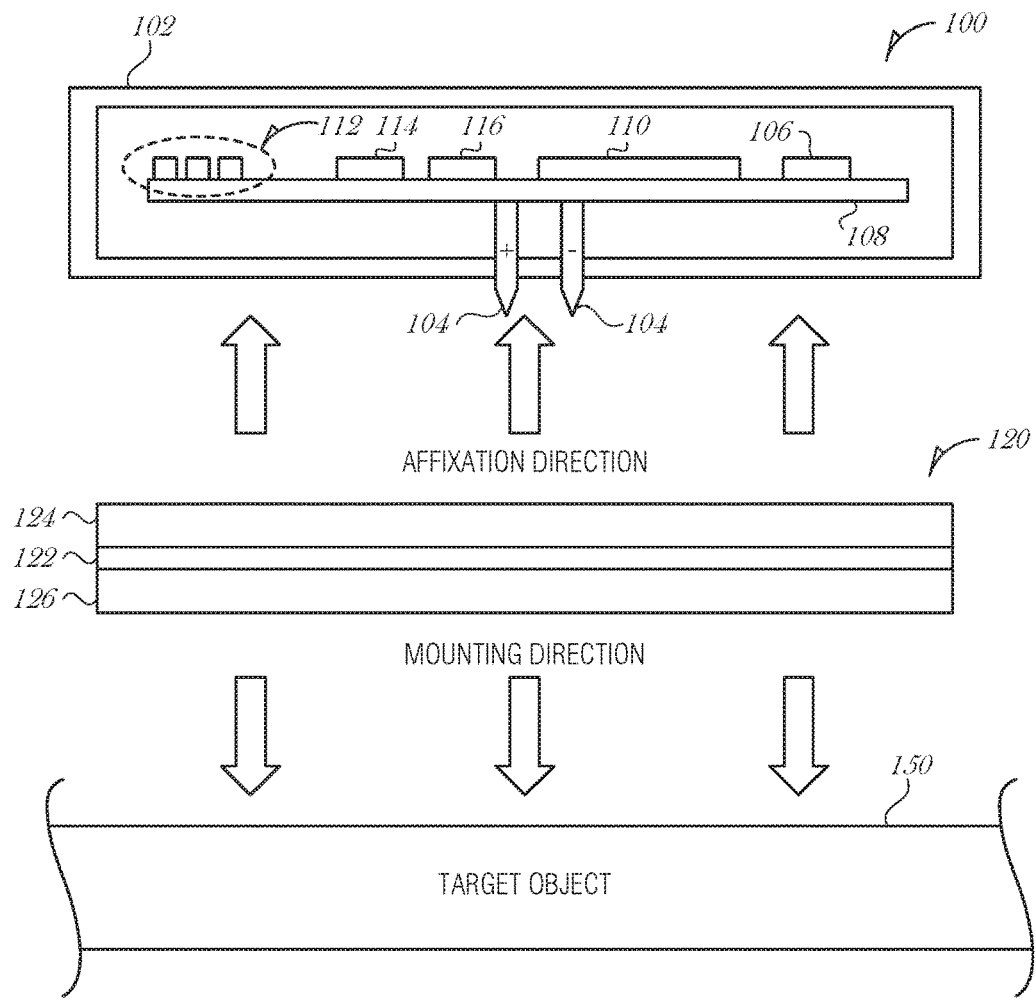
FIGS. 1A and 1B are block diagrams illustrating an electronic tag, according to an embodiment.

In the following description, for purposes of explanation, numerous specific details are set forth in order to provide a thorough understanding of some example embodiments. It will be evident, however, to one skilled in the art that the present disclosure may be practiced without these specific details.

Disclosed herein are systems and methods that provide power activation of a tracking tag via a conductive label. Logistically, it is much more economical to produce a single-journey, disposable device rather than a reusable one that is recyclable and provisioned repeatedly for multiple journeys. Given that cost is a key factor, and that tags are used primarily for one-way journeys, rechargeable batteries are not suitable and they also significantly increase unit costs.

Also, in shipping and goods transport, the quantity of packages is often very high. As a result, the shipping centers have to maintain a large inventory of shipping tags, tracking tags, or tagging devices, perhaps for a long period of time. If batteries are connected in circuit, then they may lose their power in inventory storage through system leakage current before the tracking tag devices are used. Thus, there is a need for a means of quick, easy and economical activation of the tag's power source, where the power source is activated, or energized in circuit, only when the tag is ready to be used.

In some conventional form factors, a mechanical switch or a latching reed switch may be used to activate power. In the case of a mechanical switch, the switch must be physical with a discrete ON and OFF position that does not depend on any logic or low power state to activate. In the case of a latching reed switch, a proximal magnet is used to force the switch to an ON state. Using a latching reed switch allows the switch to be completely sealed within the housing, which may increase the reliability of the tracking tag.

However, limitations of both the mechanical switch and the latching reed switch are recognized and overcome in the present disclosure. For instance, the position and accessibility of the mechanical switch may impose limits on the tag's ability to resist moisture or other contaminants since a mechanical switch may require an opening in the housing to allow manual switch actuation. Reed switches are quite expensive and increase the bill of materials (BOM) cost for the entire tag. Further, a special magnetized tool is required to activate a latching reed switch. The tool may be expensive, easy to misplace, or increase employee training costs.

What is described here is a mechanism that is easy for an employee to affix to a shipping container, has no moving parts, and has a low BOM cost. Electronics for a tracking tag, which may also be referred to as a tag device, tagging device, shipping tag, sensor mote, tag sensor, or the like, are contained in a non-conductive housing with two electrically-isolated pin contacts that protrude through the housing. The housing is affixed to a shipping container by way of a double-sided adhesive. The double-sided adhesive includes three layers: a first adhesive surface, a conductive substrate, and a second adhesive surface. The first and second adhesive surfaces may include separate adhesive layers or an adhesive material applied to the conductive substrate. The pin contacts form an electrical circuit with the conductive substrate when pushed through the double-sided adhesive as the housing is adhered to the shipping container. Once the electrical circuit is completed via the conductive substrate, the battery supplies power to the shipping tag. Additional embodiments are described throughout this document.

Figure 1B:
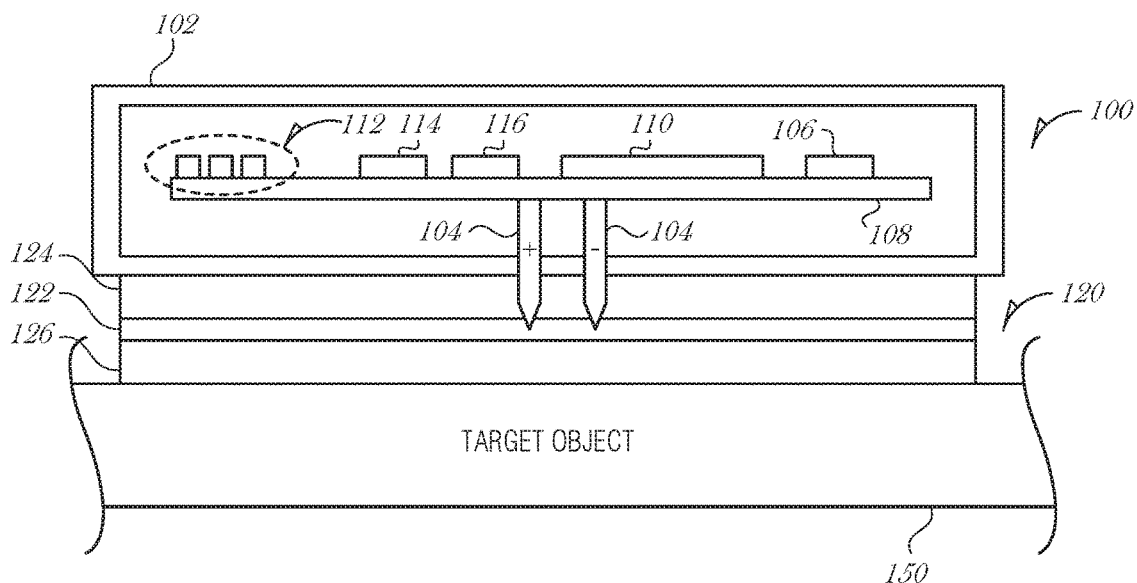

FIGS. 1A and 1B are block diagrams illustrating an electronic tag 100, according to an embodiment. FIG. 1A illustrates a cross-sectional view of the electronic tag 100 in an open-circuit state (e.g., a disabled or initial state) where no power is applied to the circuitry or other components of the tag 100. FIG. 1B illustrates the electronic tag 100 after being placed on target object 150. Target object 150 may be cargo, such as a shipping container, materials (e.g., assembled house framing, large appliances, produce container, or other high-value asset), shipping labels or manifests, or the like.

The electronic tag 100 is constructed from a non-conductive housing 102, that encloses components of the electronic tag 100. The non-conductive housing 102 may be hermetically sealed. Pin contacts 104 protrude from the housing 102 and extend from the surface of the housing 102 by some margin, such as 1-2 mm or more. The extent of the protruding length of the pin contacts 104 may vary depending on the design and application. At least one of the pin contacts 104 are electrically connected (e.g., conductively coupled) to a battery 110, however pin contacts 104 are electrically isolated from one another such that there is no current flowing. Pin contacts 104 are integrated with internal circuitry 106 on printed circuit board 108. Internal circuitry 106 is designed such that an electrical short across the pin contacts 104 closes a circuit with the battery 110 and results in power continuity to the internal circuit 106 and activation of the electronic tag 100. At least one of the pin contacts 104 is electrically connected to internal circuitry 106, which is powered by battery 110 when the electronic tag 100 is activated.

The internal circuitry 106 may be used to provide visual, audible, or haptic notifications of the tag's status. For example, several status lights 112 may be mounted to PCB 108 and electrically connected to the internal circuitry 106. The status lights 112 may be illuminated using colors, blinking patterns, or the like, to indicate the tag's status. In other examples, internal circuitry 106 may be used to drive a speaker 114, haptic actuator 116, or other device to provide status notifications. The status notifications may indicate activation, error state, battery level, communication link status, or the like. In other examples, internal circuitry 106 may include passive circuitry, such as a passive MD tag that is operable when there is an electrical short across the pin contacts 104.

An adhesive mounting label 120 is used to adhere the electronic tag 100 to the target object 150. In an example, the adhesive mounting label 120 is a double-sided adhesive with a conductive substrate 122 sandwiched between two adhesive layers: housing-side adhesive 124 and mounting-side adhesive 126. The conductive substrate may be of various conductive materials. In an embodiment, the conductive substrate is copper. Housing-side adhesive 124 and mounting-side adhesive 126 may be the same or different adhesives depending on the intended surface on which the tag 100 will be mounted. One or both of the housing-side adhesive 124 and mounting-side adhesive 126 may include pressure-activated (e.g., pressure sensitive) adhesive layers, which become adhesive in response to pressure applied while mounting the adhesive layer to a surface.

The housing-side adhesive 124 may include conductive material, which may improve the electrical conductivity as the pin contacts 104 pierce the housing-side adhesive 124 and the conductive substrate 122. In some embodiments, the conductive substrate 122 is omitted and housing-side adhesive 124 is a conductive adhesive. In other embodiments, housing-side adhesive 124 is omitted and the conductive substrate 122 is exposed, such as a conductive foil adhered to a double-sided mounting-side adhesive 126. In such embodiments where the upper surface (housing-side) is conductive, the pin contacts 104 may be rounded or flat, and may not protrude as far from the housing 102, because they do not need to pierce through the housing-side adhesive 124 and can instead complete their circuit by contacting the upper conductive surface.

FIG. 1B illustrates the electronic tag 100 after being placed on target object 150. While being adhered to the target object 150, the pins 104 pierce or contact the conductive substrate 122, and provides power to the components of the tag 100. In an embodiment where the housing-side adhesive 124 is a conductive adhesive, the pins 104 may pierce or contact only the conductive adhesive 124 to provide power to the components of the tag 100.

While one pair of pins 104 is illustrated in FIGS. 1A-1B and elsewhere in this document, it is understood that multiple pairs of pins may be used. In an embodiment, a tag may include two pairs of pins 104 to track several pieces of cargo, where the one tag bridges two or more pieces of cargo. In such an embodiment, each piece of cargo has an adhesive label affixed to it to adhere the electronic tag and provide electrical conductivity for each pair of the conductive pins from the electronic tag, such that the tag 100 is only activated when all pairs of pins are inserted into their respective conductive adhesive labels. Using a single electronic tag on multiple shipping pieces may be an integral way to provide shipping security. Embodiments with multiple shipping object are illustrated in FIGS. 2 and 3.

Figure 2:
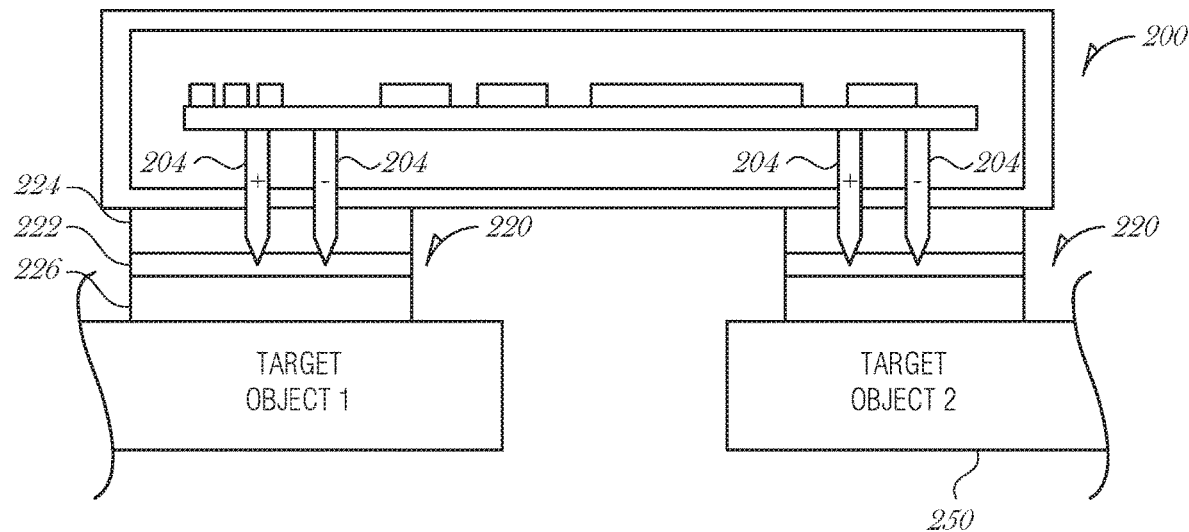
FIG. 2 is a block diagram illustrating an electronic tag, according to an embodiment.

FIG. 2 is a block diagram illustrating an electronic tag 200, according to an embodiment. Electronic tag 200 includes two pairs of pins 204, each pair affixed to separate adhesive labels 220 that are affixed to separate objects 250 (or separate parts of a single object). The adhesive labels 220 include respective conductive substrates 222 interposed between a housing-side adhesive layer 224 and a mounting-side adhesive layer 226. It is understood that other adhesive arrangements may be used in this embodiment.

Figure 3:
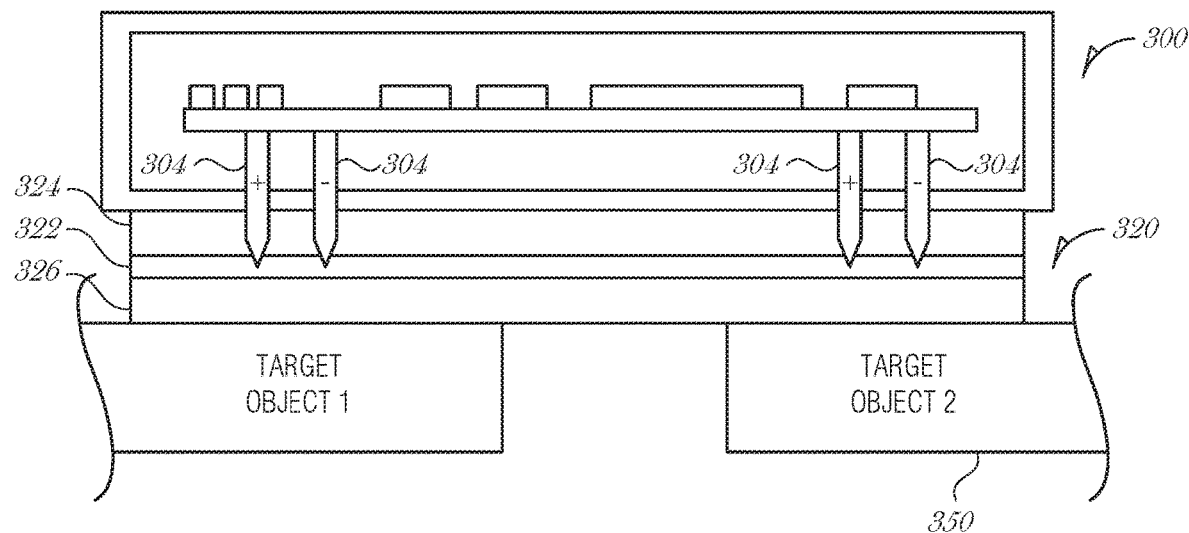
FIG. 3 is a block diagram illustrating an electronic tag, according to an embodiment.

FIG. 3 is a block diagram illustrating an electronic tag 300, according to an embodiment. Electronic tag 300 includes two pairs of pins 304, each pair affixed to the same adhesive label 320 that is affixed to separate objects 350 (or separate parts of a single object). The adhesive labels 320 includes conductive substrate 322 interposed between a housing-side adhesive layer 324 and a mounting-side adhesive layer 326. It is understood that other adhesive arrangements may be used in this embodiment.

Figure 4:
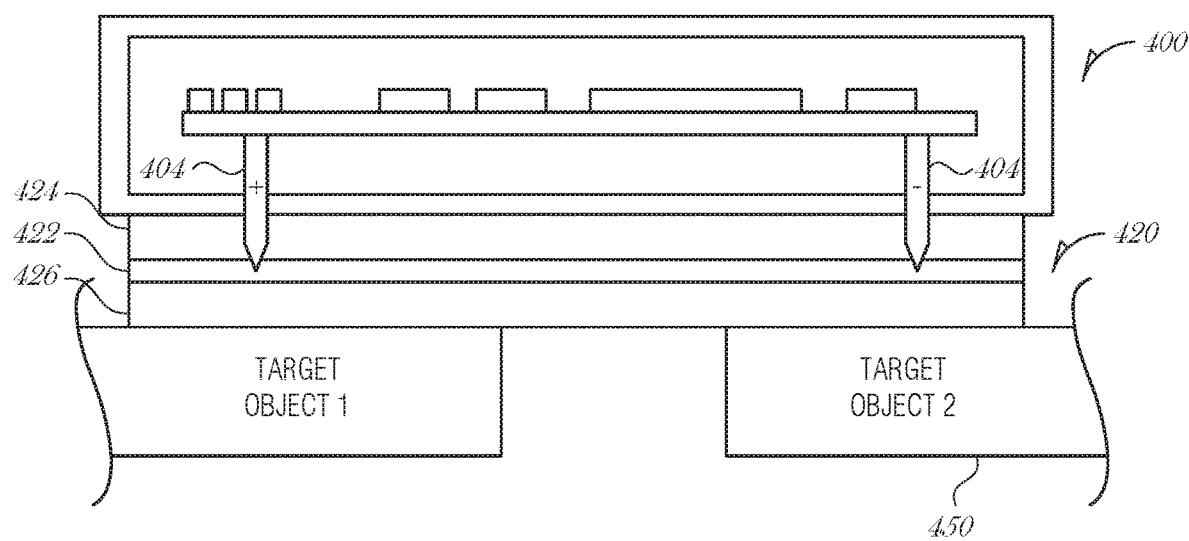
FIG. 4 is a block diagram illustrating an electronic tag, according to an embodiment.

FIG. 4 is a block diagram illustrating an electronic tag 400, according to an embodiment. Electronic tag 400 includes one pair of pins 404, with each pin affixed to the same adhesive label 420 that is affixed to separate objects 450 (or separate parts of a single object). The adhesive labels 420 includes conductive substrate 422 interposed between a housing-side adhesive layer 424 and a mounting-side adhesive layer 426. It is understood that other adhesive arrangements may be used in this embodiment.

Figure 5A:
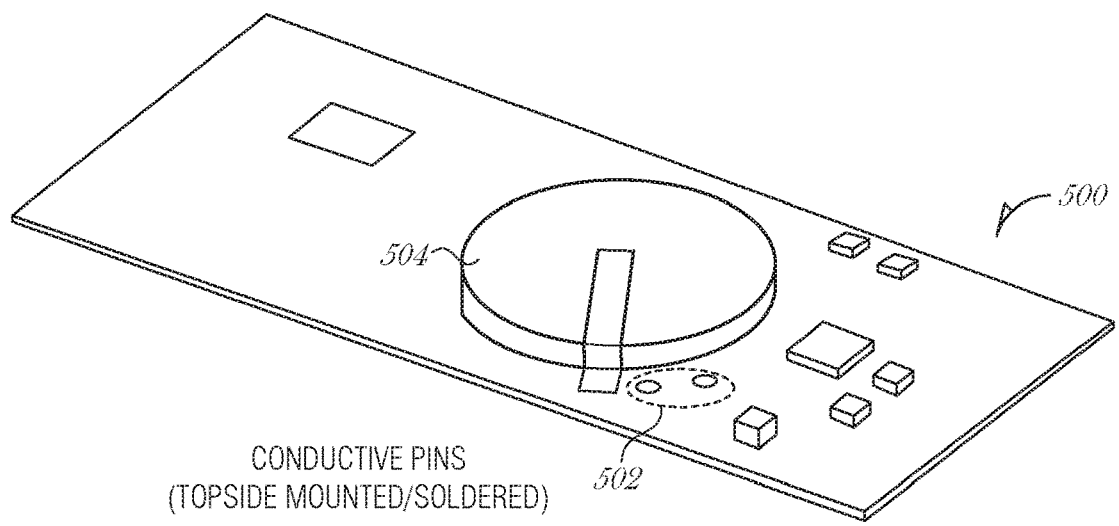
FIGS. 5A-5B are block diagrams illustrating a printed circuit board (PCB), according to an embodiment.
Figure 5B:
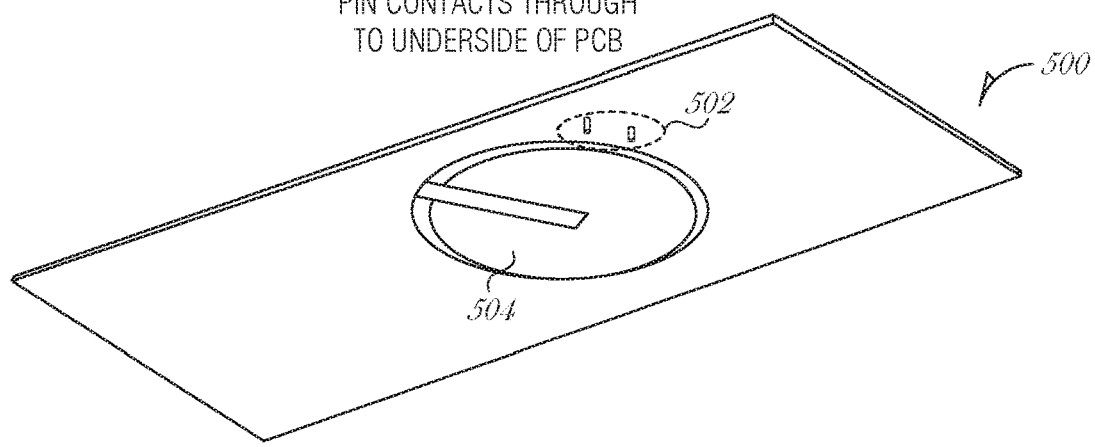

FIGS. 5A-5B are block diagrams illustrating a printed circuit board (PCB) 500, according to an embodiment. FIG. 5A is a top perspective view of the PCB 500, which includes conductive pins 502, which are soldered or mounted on the PCB 500 and electrically coupled to a battery 504 and additional tag circuitry components by traces. Various tag circuitry components, such as communications packages, processors, memory devices, speakers, lights, haptic actuators, tilt sensor, accelerometer, radio frequency identification (RFD) circuitry, environmental sensors (e.g., humidity, temperature, moisture, ambient light, ambient noise, etc.), or the like, may be incorporated on the PCB 500. The battery 504 is in an open circuit state while conductive pins 502 are conductively isolated. Conductive pins 502 may be mounted or soldered on the topside of the PCB 500 and penetrate the PCB 500 to extend below the lower surface of the PCB 500. FIG. 5B is a bottom perspective view of the PCB 500 illustrating the conductive pins 502 extending beyond the plane of the lower surface of the PCB 500.

Figure 6A:
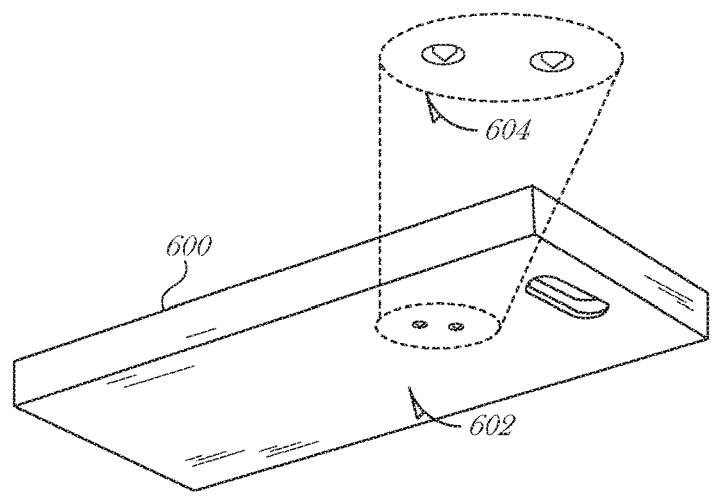
FIGS. 6A-6B are block diagrams illustrating a housing, according to an embodiment.
Figure 6B:
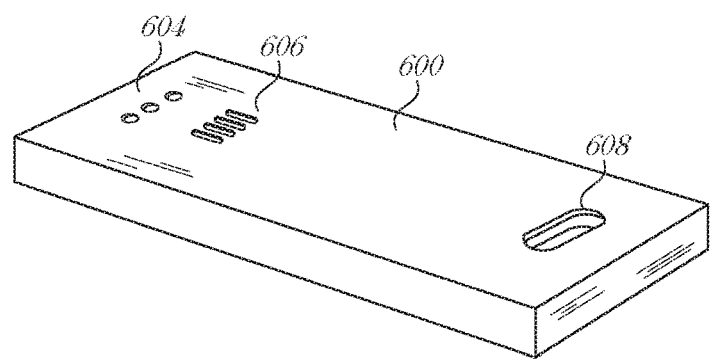

FIGS. 6A-6B are block diagrams illustrating a housing 600, according to an embodiment. The housing 600 may be used to enclose a PCB, such as PCB 200 of FIG. 2. FIG. 6A is a bottom view of the housing 600 including a bottom surface 602 with ports 604 through which conductive pins 606 may protrude. The bottom surface 602 is substantially planar to provide greater contact area for adhering to the package, cargo, or other shipping article. The ports 604 are illustrated as being relative close to one another, however, it is understood that their placement may vary depending on the design and application of the electronic tag. FIG. 6B is a top view of the housing 600 illustrating optional ports for status lights 604, speaker grill 606, and a hanging tab hole 608, which may be used to hang the electronic tag on a wire rack or hook.

Shipping is a very time-sensitive and cost-sensitive industry, and while electronic tagging is valuable in managing loss prevention, it must not impose undue delay, cost, or complexity to the shipping process. The electronic tag described here provides an efficient means of power activation during a natural part of tagging a cargo item with an adhesive label. End customers will benefit from two elements provided by the electronic tag: 1) Automatic tag activation via affixation of the tag to the cargo item (operator will not forget to activate the tag); and 2) Efficient/repeatable work flow in tag handling (operator need not be trained to activate the tag, or use any special tools).

The electronic tag described here may be stacked for shipping or assembly. When stacked, the protruding pins of one stacked tag would be insulated from one another based on contact with the non-conductive housing of the electronic tag stacked below.

In an embodiment, electronic tags may be configurable to be ganged together such that two or more tags are used to track one shipping article or multiple related shipping articles. For example, two tags may be required to be applied to a conductive adhesive shipping label to activate both tags. Multiple tags may be used in other settings, such as assembly line manufacturing, for example. Tags may be used to track parts lines and subassemblies during manufacture.

In a related embodiment, an electronic tag may be arranged or configured with pairs of conductive pins that are relatively distant from one another (e.g., 3-5 inches). With pins that are disposed in such a manner, the electronic tag may be used to bridge two shipping articles (e.g., one pair of pins on each article), or bridge two portions of the same article. For example, separated conductive pins may be used to bridge two closure flaps of a shipping box that have been sealed with a conductive packing adhesive tape, and may be used to detect when the conductive packing adhesive tape has been tampered with or broken in transit. In this configuration, the electronic tag may be used as a security device to ensure that one or more shipping articles are not separated or tampered with during shipping.

In a related embodiment, an electronic tag may be arranged or configured with one or more pairs of conductive pins that are in a predetermined pattern. For example, a packing label may include an embedded strip of conductive substrate, and the electronic tag may be required to be placed in a particular location or orientation on the packing label to activate the electronic tag. In another example, the electronic tag may include multiple electronic components electrically connected to various combinations of conductive pins, and one or more of the electronic components may be activated based on the location or orientation of the electronic tag on the packing label. The activation of various electronic components may be used to provide additional security, to provide different electronic functionality for various legs of a multiple destination shipping journey.

ADDITIONAL NOTES & EXAMPLES

Example 1 is an electronic shipping tag comprising: a housing to enclose: a printed circuit board having: a battery; load circuitry; and a plurality of pins that project from the housing, such that when contacted with a conductive substrate, cause activation of the load circuitry.

In Example 2, the subject matter of Example 1 includes, wherein the housing is non-conductive.

In Example 3, the subject matter of Examples 1-2 includes, wherein the housing is hermetically sealed.

In Example 4, the subject matter of Examples 1-3 includes, wherein the conductive substrate is integrated with an adhesive mounting label to affix the electronic shipping tag to a shipping object.

In Example 5, the subject matter of Examples 1-4 includes, wherein the adhesive mounting label comprises a housing-side adhesive layer, a mounting-side adhesive layer, and the conductive substrate interposed between the housing-side adhesive layer and the mounting-side adhesive layer.

In Example 6, the subject matter of Example 5 includes, wherein the housing-side adhesive layer comprises a pressure sensitive adhesive.

In Example 7, the subject matter of Examples 5-6 includes, wherein the mounting-side adhesive layer comprises a pressure sensitive adhesive.

In Example 8, the subject matter of Examples 4-7 includes, wherein the conductive substrate is a conductive adhesive.

In Example 9, the subject matter of Examples 1-8 includes, wherein the load circuitry includes a status light.

In Example 10, the subject matter of Examples 1-9 includes, wherein the load circuitry includes a speaker.

In Example 11, the subject matter of Examples 1-10 includes, wherein the load circuitry includes a haptic actuator.

In Example 12, the subject matter of Examples 1-11 includes, wherein the plurality of pins includes a first pair of pins and a second pair of pins.

In Example 13, the subject matter of Example 12 includes, wherein the load circuitry is activated when the first pair of pins is in a closed circuit operable by a first adhesive mounting label and the second pair of pins is in a closed circuit operable by a second adhesive mounting label.

In Example 14, the subject matter of Examples 1-13 includes, wherein the plurality of pins is arranged in a predetermined conductive pin pattern, the conductive pin pattern corresponding to a conductive substrate pattern.

In Example 15, the subject matter of Examples 1-14 includes, wherein the load circuitry includes a first electronic component and a second electronic component, wherein the plurality of pins is arranged to cause activation of the first electronic component when the housing is applied to the conductive substrate in a first tag orientation and cause activation of the second electronic component when the housing is applied to the conductive substrate in a second tag orientation.

Example 16 is at least one machine-readable medium including instructions that, when executed by processing circuitry, cause the processing circuitry to perform operations to implement of any of Examples 1-15.

Example 17 is an apparatus comprising means to implement of any of Examples 1-15.

Example 18 is a system to implement of any of Examples 1-15.

Example 19 is a method to implement of any of Examples 1-15.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

What is claimed is:

1. An electronic shipping tag comprising:
   a housing to enclose:
      a printed circuit board having:
         a battery;
         load circuitry; and
      a plurality of pins that project from the housing, such that when contacted with a conductive substrate, cause activation of the load circuitry,
   wherein the conductive substrate is integrated with an adhesive mounting label to affix the electronic shipping tag to a shipping object, the adhesive mounting label comprises a housing-side adhesive layer, a mounting-side adhesive layer, and the conductive substrate interposed between the housing-side adhesive layer and the mounting-side adhesive layer, and wherein the plurality of pins form an electrical circuit with the conductive substrate when pushed through the housing-side of the adhesive layer as the housing is adhered to an object.

2. The electronic shipping tag of claim 1, wherein the housing is non-conductive.

3. The electronic shipping tag of claim 1, wherein the housing is hermetically sealed.

4. The electronic shipping tag of claim 1, wherein the housing-side adhesive layer comprises a pressure sensitive adhesive.

5. The electronic shipping tag of claim 1, wherein the mounting-side adhesive layer comprises a pressure sensitive adhesive.

6. The electronic shipping tag of claim 1, wherein the load circuitry includes a status light.

7. The electronic shipping tag of claim 1, wherein the load circuitry includes a speaker.

8. The electronic shipping tag of claim 1, wherein the load circuitry includes a haptic actuator.

9. The electronic shipping tag of claim 1, wherein the plurality of pins includes a first pair of pins and a second pair of pins.

10. The electronic shipping tag of claim 9, wherein the load circuitry is activated when the first pair of pins is in a closed circuit operable by a first adhesive mounting label and the second pair of pins is in a closed circuit operable by a second adhesive mounting label.

11. The electronic shipping tag of claim 1, wherein the plurality of pins is arranged in a predetermined conductive pin pattern, the conductive pin pattern corresponding to a conductive substrate pattern.

12. The electronic shipping tag of claim 1, wherein the load circuitry includes a first electronic component and a second electronic component, wherein the plurality of pins is arranged to cause activation of the first electronic component when the housing is applied to the conductive substrate in a first tag orientation and cause activation of the second electronic component when the housing is applied to the conductive substrate in a second tag orientation.

* * * * *